United States Patent
Reinhold et al.

(10) Patent No.: US 9,349,353 B2
(45) Date of Patent: May 24, 2016

(54) METHOD AND APPARATUS FOR EFFICIENT STORAGE OF FREQUENCY VALUES FOR A DISPLAY DEVICE

(71) Applicant: Rohde & Schwarz GmbH & Co. KG, Munich (DE)

(72) Inventors: Michael Reinhold, Munich (DE); Bernhard Nitsch, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/556,024

(22) Filed: Nov. 28, 2014

(65) Prior Publication Data
US 2016/0063966 A1 Mar. 3, 2016

Related U.S. Application Data

(63) Continuation-in-part of application No. 14/473,360, filed on Aug. 29, 2014.

(51) Int. Cl.
G09G 5/393 (2006.01)
G09G 5/399 (2006.01)
G06T 1/60 (2006.01)

(52) U.S. Cl.
CPC *G09G 5/393* (2013.01); *G06T 1/60* (2013.01); *G09G 5/399* (2013.01)

(58) Field of Classification Search
CPC .................................. G06T 1/60; G09G 5/393
See application file for complete search history.

(56) References Cited

U.S. PATENT DOCUMENTS

| 5,250,935 A * | 10/1993 | Jonker | F02P 17/08 324/379 |
| 2009/0009524 A1 * | 1/2009 | Schmidt | H03K 21/12 345/543 |
| 2011/0314253 A1 * | 12/2011 | Jacob | G06T 1/60 711/220 |
| 2014/0009642 A1 | 1/2014 | Jeong | |

FOREIGN PATENT DOCUMENTS

WO  WO2010025196 A1  3/2010

* cited by examiner

*Primary Examiner* — James A Thompson
*Assistant Examiner* — Tapas Mazumder
(74) *Attorney, Agent, or Firm* — Potomac Technology Law, LLC

(57) ABSTRACT

A device and corresponding operational method for storing frequency values to a memory of the device, comprising an internal memory and an external memory, are provided. A frequency value in a memory cell of the internal memory is actualized by an increment or a decrement. After a specific number of increments and decrements in the memory cells of the internal memory, a maximum frequency value of the frequency values stored in the memory cells of the internal memory is determined, and the maximum frequency value is transferred to a corresponding memory cell of the external memory. The memory cell of the internal memory that contains the transferred maximum frequency value is reset. After a period, content of each memory cell of the internal and external memory is read, and each memory cell of the internal and external memory is reset.

15 Claims, 4 Drawing Sheets

METHOD AND APPARATUS FOR EFFICIENT STORAGE OF FREQUENCY VALUES FOR A DISPLAY DEVICE

RELATED APPLICATIONS

This application is a continuation-in-part, and claims the priority under 35 U.S.C. §120, of U.S. application Ser. No. 14/473,360 (filed 2014 Aug. 29).

FIELD OF THE INVENTION

The invention relates to a device with a memory comprising an internal and external memory, and more specifically, a measuring device with a display memory comprising an internal and external memory, and to a corresponding method for operation of the device.

BACKGROUND OF THE INVENTION

In modern measuring devices, especially in modern digital oscilloscopes, a huge number of periodic measuring portions of a signal to be measured and to be displayed per time unit are acquisitioned. In future digital oscilloscopes about 1,000,000 acquisitions per second are determined. Thus, updating the display in a period of 30 milliseconds leads to about 33,000 acquisitions per update cycle to be handled in a display memory of the oscilloscope.

If 33,000 acquisitions are measured in an update cycle, one single pixel per column of the display can be hit 33,000 times in an update cycle in the worst case. Taking into account this worst case, each memory cell in the display memory assigned to a specific pixel of the display has to store a data of ld(33,000)=16 bits. Thus, in case of a display memory with 1250× 800 memory cells, a memory capacity of 16 MBits is necessary. Thus a display memory for 4 displays has a memory capacity of 64 MBits. Using an ASIC for implementing such a display memory results in a comparatively too large amount of the total chip area for memory purpose (for example more than 50% of the total chip area).

For reducing the memory space of a display memory in a semiconductor chip, the display memory in US 2014/0009642 A1 is separated in an internal memory and an external memory realized as flash memory or as optical memory. A digital oscilloscope with such kind of memory is known from WO 2010/025196 A1.

The transfer of sampled values from the internal memory to the external memory is performed, if a value in a memory cell of the internal memory reaches its maximum possible value. The transfer is limited by the bandwidth of the interface between internal and external memory resulting in the following disadvantage. In the case, in which in each column of the display only one single pixel per column is hit very often within an update cycle, a limited bandwidth of the interface results in an additional buffering of high frequency values over a longer period requiring a larger length of the memory cells in the internal memory.

Additionally, the transfer of data over the interface varies over time. In addition to times during which the data transfer pauses, times exist during which too many data to be overflowed in the memory cells of the internal memory, which have to be transferred simultaneously. Accordingly, limited bandwidth of the interface leads to a longer buffering of that data in the internal memory, which has to be enlarged in its capacity for this demand.

Furthermore, the case in which in each column of the display only one single pixel per column is hit very often within an update cycle, which leads to unbalanced data transfer over the time.

What is needed, therefore, is an approach for a device, such as a measurement device, with internal and external memory, and a balancing data transfer over time, between the internal and external memory, such as data transfer between internal and external memory for a display memory of a measurement device.

SUMMARY OF THE INVENTION

Embodiments of the present invention advantageously address the foregoing requirements and needs, as well as others, by providing an approach for a device, such as a measurement device, with internal and external memory, and a balancing data transfer over time, between the internal and external memory, such as data transfer between internal and external memory for a display memory of a measurement device.

According to example embodiments of the present invention, a device contains a memory for storing frequency values, whereby the memory consists of an internal and external memory. The device comprises an internal memory and an external memory. The device further comprises an actualizing unit configured to actualize a frequency value in a memory cell of the internal memory by an increment or a decrement if a condition for the increment in the corresponding memory cell is fulfilled. The device further comprises a control unit configured to, after a specific number of increments and decrements in the memory cell of the internal memory, determine a maximum frequency value from the frequency values in the memory cells of the internal memory, and transfer the maximum frequency value to a corresponding memory cell of the external memory of the device. The control unit is further configured to then reset the memory cell of the internal memory that contains the transferred maximum frequency value. After a period, the content of each memory cell of the internal and external memory are read out, and then the control unit resets each memory cell of the internal and external memory.

The transfer of the maximum frequency value from the internal to the external memory after a specific number of increments and decrements in the memory cells of the internal memory facilitates the use of a reduced number of bits for the memory cells of the internal memory, and distributes the data transfer of the maximum frequency values from the internal to the external memory equally over the time (e.g., after each of a specific number of increments and decrements in the internal memory).

According to one example embodiment, the device consists of a measurement device for displaying frequency values of a measured signal, whereby the internal and external memory units make up a display memory for updating a display of the measurement device after each period (e.g., based on the update cycle of the display). The increment or decrement of a frequency value in a memory cell of the internal memory occurs, for example, when a sampled value of the measured signal hits the sampled value range, and the time point and respectively the frequency bin of the pixel in the display, which corresponds to the memory cell in the internal memory within the actual update cycle. Furthermore, the control unit in the measurement device determines for each column of the display a corresponding maximum frequency value from the frequency values in the memory cells of the internal memory corresponding to all the pixels in the corresponding column of the display. The control unit further transfers the determined maximum frequency value from the frequency values in memory cells corresponding to all the pixels of a column in the display to a corresponding memory cell in the external memory, which is incremented since the last transfer of a maximum frequency value to a memory cell in the external memory, which is determined from the frequency values in the memory cells of the internal memory corresponding to pixels of the corresponding column in the display. In this context, the detection of the maximum frequency value corresponding to one of the columns of the display can be performed simultaneously during the incrementing or decrementing of the memory cells in the internal memory. That is comparably less time consuming than the detection of the maximum frequency value in all memory cells corresponding to all pixels of a column at the end of a specific number of increments and decrements.

By way of example, the transfer of the detected maximum frequency value corresponding to one of the columns of the display to a corresponding memory cell in the external memory may be performed after a specific number of increments in memory cells of the internal memory corresponding to all the pixels of one of the columns of the display plus an offset value, which is different for each column of the display. Thus, the different offset value for each column of the display distributes the transfer of the maximum frequency value determined for all the pixels of each column of the display over the time and avoids a bottleneck in the data transfer via the interface between internal and external memory.

By way of further example, the transferred maximum frequency value contains only a reduced number of the total number of bits in each memory cell of the internal memory, wherein the reduced number of bits may comprise the most significant bits stored in the corresponding memory cell. Further, the content of the maximum frequency value in the reduced number of bits in the corresponding memory cell of the internal memory may be transferred to the corresponding least significant bits of the corresponding memory cell in the external memory. The reduction of bits in each transferred maximum frequency value decreases the volume of transferred data over the interface between internal and external memory and advantageously alleviates the bottleneck in the data transfer.

By way of further example, each data transfer over the interface between the internal and external memory contains a maximum frequency value corresponding to one column of the display and additional frequency values, all of which are read and respectively written in the same burst in a memory block of the external memory. Further, the frequency values stored in the same memory block of the external memory and handled in the same burst may be stored in neighboring memory cells in the internal memory, and are read in the same burst from the internal memory and correspond to pixels, which are neighboring to the pixel with the maximum frequency value and have thus comparably high frequency values. Thus, a data transfer of multiple frequency values in one burst is advantageously enabled without additional expenditure in transfer bandwidth in comparison to the data transfer of only one frequency value (e.g., the data transfer of the maximum frequency value).

By way of further example, the total bits of the memory cell in the internal memory, in which the determined maximum frequency value corresponding to one column of the display is stored, are separated into a specific number of least significant bits and a corresponding number of most significant bits. Further, the content of the most significant bits may be transferred to a first memory cell of the external memory, while the content of the least significant bits are only transferred to a second memory cell of the external memory, if the content of the most significant bits is different from zero. The content in the least significant bits of a memory cell in the internal memory and respectively in the external memory may be read and respectively written in a different burst to the content in the most significant bits of a memory cell in the internal memory resp. in the external memory.

Accordingly, maximum frequency values may be advantageously handled in different value ranges—e.g., a first group of maximum frequency values, which can be stored in the least significant bits of the memory cell without using the most significant bits in the memory cell, and a second group of maximum frequency values, which can be stored in the most significant bits being different from zero in combination with the least significant bits of the memory cell. Moreover, by storing the content of the maximum frequency value in the least significant bits of the memory cell of the internal memory in a first memory cell of the external memory and the content of the maximum frequency value in the most significant bits of the memory cell of the internal memory in a second memory cell of the external memory—being in a different memory block to the memory block of the first memory cell—a maximum frequency value of the first group determined comparatively often can be transferred more often to the external memory as a maximum frequency value of the second group determined comparatively random. Thus, data transfer of a maximum frequency value of the second group over the interface between internal and external memory is reduced resulting in avoiding the bottleneck in the interface.

By way of further example, the length of the memory cells in the internal memory is smaller than the length of the memory cells in the external memory. Thus the data in the memory cells in the internal memory statistically overflows multiple times within one update cycle and has to be transferred to the external memory and to be added to the already stored data in the corresponding memory cell. The maximum frequency value is transferred from the memory cell of the internal memory to a number of least significant bits of the corresponding memory cell of the external memory, whereby the number of bits in the memory cells of the internal memory is also smaller than the number of least significant bits of the memory cells of the external memory. If the number of least significant bits in the memory cell of the external memory is not sufficient for the result of that addition, an add carry from the least significant bits to the most significant bits in the memory cell of the external memory has to be performed. The number of least significant bits in the memory cells of the external memory is parameterized in such a manner, that a time consuming add carry from the least significant bits to the most significant bits occurs comparatively very rarely. The transfer of a maximum frequency value from the internal memory to only a reduced number of bits in the memory cell in the external memory (e.g., the least significant bits of the memory cell in the external memory, enables the integrated transfer of data to several memory cells in the external memory within one burst).

By way of further example, the resetting of the memory cell in the internal memory, which contains the determined maximum frequency value corresponding to one column of the display, results in storing an initial value being different to zero instead of the value zero in the memory cell of the internal memory. Further, by the use of the line-mode, for example, according to US 2009/0009524 A1 (hereby incorporated herein by reference in its entirety) the memory cells in the internal memory can be incremented or decremented resulting in both positive frequency values and negative frequency values.

For example, in the case of a positive maximum frequency value the initial value is preferably the most negative possible value and in case of a negative maximum frequency value the initial value is preferably the most positive possible value. If a positive maximum frequency value is detected in a memory cell of the internal memory, a positive maximum frequency value would be most probably contained in the same memory cell within the next number of increments in the memory cells of the internal memory corresponding to all pixels of the corresponding column in the display. Thus by resetting the memory cell of the internal memory containing the transferred maximum frequency value to an initial value being the most negative possible value the number of necessary increments for a detection of a new maximum frequency value in the same memory is increased in comparison to the other memory cells in the internal memory. The transfer rate of a maximum frequency value from the same memory cell in the internal memory to a corresponding memory cell in the external memory is thus decreased.

Alternatively, if a negative maximum frequency value is detected in a memory cell of the internal memory, a negative maximum frequency value would be most probably contained in the same memory cell within the next number of decrements in the memory cells of the internal memory corresponding to all pixels of the corresponding column in the display. Thus, by resetting the memory cell of the internal memory containing the transferred maximum frequency value to an initial value being the most positive possible value the number of necessary decrements for a detection of a new negative maximum frequency value in the same memory is increased in comparison to the other memory cells in the internal memory. The transfer rate of a maximum frequency value from the same memory cell in the internal memory to a corresponding memory cell in the external memory is thus decreased.

BRIEF DESCRIPTION OF THE DRAWINGS

These and other features, aspects and advantages of the present invention will become better understood with regard to the following description, appended claims and accompanying drawings. Identical components in the drawings are provided with the same reference numbers. Accordingly, embodiments of the present invention are illustrated by way of example, and not by way of limitation, in the figures of the accompanying, in which:

DETAILED DESCRIPTION

An approach for a device, such as a measurement device, with internal and external memory, and a balancing data transfer over time, between the internal and external memory, such as data transfer between internal and external memory for a display memory of a measurement device, along with corresponding methods, are described. In the following description, for the purposes of explanation, numerous specific details are set forth in order to provide a thorough understanding of the invention. It is apparent, however, that embodiments of the invention may be practiced without these specific details or with an equivalent arrangement. In other instances, well known structures and devices are shown in block diagram form in order to avoid unnecessarily obscuring the invention.

Figure 1:
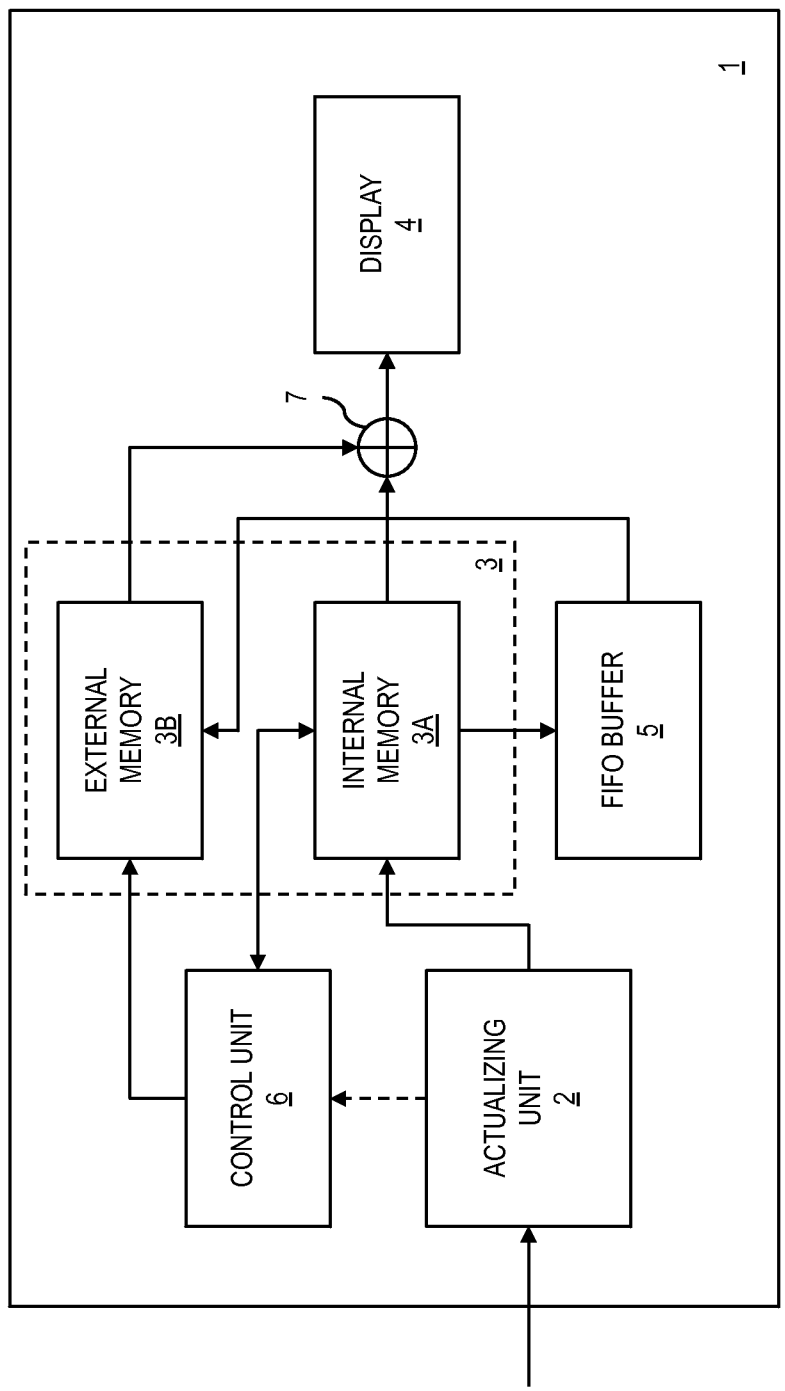
FIG. 1 illustrates a block diagram of a device with a memory consisting of an internal and external memory, in accordance with example embodiments of the present invention.
Figure 2:
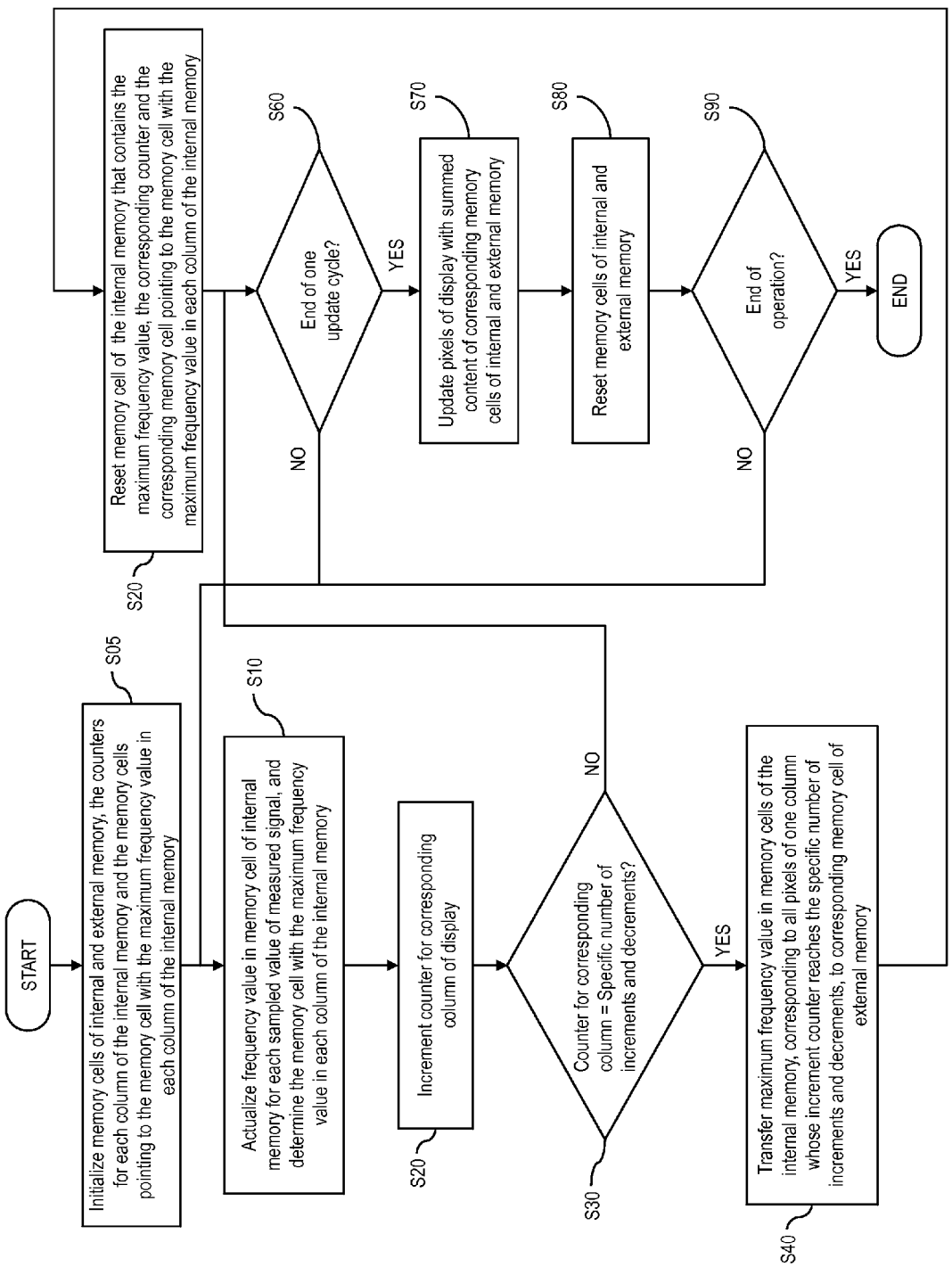
FIG. 2 illustrates a flowchart depicting a method for storing frequency values to a memory consisting of an internal and external memory (such as the memory of the device of FIG. 1), in accordance with example embodiments of the present invention.

FIG. 1 illustrates a block diagram of a device with a memory consisting of an internal and external memory, and FIG. 2 illustrates a flowchart depicting a method for storing frequency values to a memory consisting of an internal and external memory (such as the memory of the device of FIG. 1), in accordance with example embodiments of the present invention. In accordance with one example embodiment, the device of FIG. 1 consists of a measuring device (such as a digital oscilloscope).

With reference to FIGS. 1 and 2, in the first step S05, a control unit 6 of the device 1 initializes each memory cell in the internal memory 3A and in the external memory 3B with zero values. Further, each counter, which counts the number of increments and decrements in the memory cells of the internal memory 3A corresponding to all pixels of one column of the display 4, is initialized with a value zero. Also, each memory cell, which points to the memory cell with the maximum frequency value in the memory cells in the internal memory 3A corresponding to all pixels of one column in the display 4, is initialized with an appropriate value. According to one example embodiment, one or more of such counters and such memory cells are integrated in the control unit 6.

In the following step S10, the actualizing unit 2 determines (e.g., for a sampled value of a measured signal) the corresponding sampled value range and the corresponding time point and respectively the corresponding frequency bin and corresponding pixel in the display 4, and the corresponding memory cell in the internal memory 3A of the display memory 3. The internal memory 3A may, for example, be implemented in an integrated circuit, which can be realized as application specific integrated circuit (ASIC) or as a field programmable gate array (FPGA), which may comprise further technical functions of the measurement device such as acquisition and triggering. Further, the frequency value already stored in the corresponding memory cell in the internal memory 3A is actualized by an increment. As would also be apparent, for example, in the case of a line-mode according to US 2009/0009524 A1, the frequency value stored in a memory cell of the internal memory 3A can be actualized by an increment or by a decrement.

In the step S10, further, the control unit 6 determines the maximum positive respective negative frequency value in the memory cells of the internal memory 3A, corresponding to all pixels in one column in the display 4, by comparing the actualized value to the value in a memory cell corresponding to the same column and having the maximum frequency value in the last increment/decrement step, respectively. The memory cell in the internal memory 3A, having the maximum frequency value of all memory cells corresponding to all pixels of one column in the display 4, is indicated by a memory cell pointing to that memory cell. According to one example embodiment, the memory cell corresponding to one column of the display 4, which may be integrated in the control unit 6, is actualized in each increment/decrement step, respectively, of a memory cell corresponding to a pixel of that column. This kind of comparison advantageously reduces the number of comparisons from the huge number of comparisons between all memory cells corresponding to each pixel in one column to one comparison between two memory cells.

In the next step S20, the counter counting the increments and decrements in memory cells of the internal memory 3A, corresponding to all pixels of a column of the display 4, to which the memory cell corresponds, which is incremented or decremented in the last step S10, is incremented. For simplicity in the description, each counter corresponding to a column of the display 4 is not shown in FIG. 1. Further, by way of example, the counters may be integrated in the control unit 6. Each increment and each decrement in a memory cell of the internal memory 3A is detected by the control unit 6—e.g., by information from the actualizing unit 2, which determines an increment or a decrement in a memory cell of the internal memory 3A (see the dotted arrow from the actualizing unit 2 to the control unit 6 in FIG. 1) and leads to an increment of the corresponding counter by the control unit 6.

In next step S30, the control unit 6 determines whether the counter incremented in the last step S20 reaches a specified number of increments and decrements. The specified number of increments and decrements is appropriately selected to enable a balanced data transfer in the interface between the internal memory 3A and the external memory 3B of the display memory 3 over the time and thus to avoid a bottleneck in the interface. The external memory 3B, for example, may be a volatile random access memory (RAM), a flash memory or an optical memory such as a compact disc (CD) or a digital video disc (DVD) inserted in a disc device inside the measurement device 1.

If the counter incremented in the last step S20 reaches a specified number of increments and decrements in step S30, in the next step S40, the control unit 6 determines the maximum frequency value from the frequency values in memory cells of the internal memory 3A, which correspond to all pixels of the column in the display 4, whose counter reaches the specified number of increments and decrements in step S30. Further, the control unit 6 also transfers the determined maximum frequency value from its memory cell in the internal memory 3A to the corresponding memory cell in the external memory 3B.

As the transfer data rate in the interface between the internal memory 3A and the external memory 3B is limited and is typically below the rate, in which two maximum frequency values corresponding to different columns (e.g., neighboring columns) of the display 4 are determined and have to be transferred over the interface to the external memory 3B, a buffer 5 is connected in the interface between the internal memory 3A and the external memory 3B for buffering at least one maximum frequency value for a further transfer to the external memory 3B. The buffer 5, for example, may consist of a first-in-first-out (FIFO) buffer.

In the next step S50, the control unit 6 resets the memory cell containing the maximum frequency value in the internal memory 3A.

After resetting the memory cell containing the maximum frequency value in the internal memory 3A, in the next step S60, the control unit 6 determines if the actual update cycle is ended. The step S60 is also reached if the counter incremented in step S20 does not reach the specified number of increments and decrements in step S30. If the actual update cycle is not ended, the next sampled value of the measured signal leads back to step S10, and actualization of the corresponding memory cell in the internal memory 3A by adding an increment or a decrement to the frequency value stored in the corresponding memory cell. If the actual update cycle is ended, in the next step S70, the pixels of the display 4 are updated with content of the corresponding memory cells in the internal memory 3A and in the external memory 3B of the display memory 3. Accordingly, the content of the memory cells in the internal memory 3A and in the external memory 3B are summed in a summation unit 7 connected between the internal memory 3A and in the external memory 3B of the display memory 3 and the display 4. According to an alternate embodiment, the update of the display 4 may be controlled by a further control unit, which is not shown in FIG. 1.

In the next step S80 each memory cell in the internal memory 3A and in the external memory 3B of the display memory 3 is reset.

In the next step S90, it is determined whether the operation of the measurement device 1 has ended (e.g., is ended by a user of the device). In case of an end of the operation the process/operation ends. If it is determined that the operation of the measurement device 1 has not ended, the process returns to step S10, whereby the next sampled value of the measured signal in the next update cycle leads to an actualization of the corresponding memory cell in the internal memory 3A by adding an increment or a decrement to the frequency value stored in the corresponding memory cell.

According to a first further embodiment, in step S30, the counter corresponding to a specific column of the display 4 is compared to a specified number of increments and decrements plus an offset value, which is different for each column of the display 4. In case of different offset values for each column, the transfer of data from memory cells in the internal memory 3A corresponding to different columns to the external memory 3B can be spread more equally over time.

Figure 3:
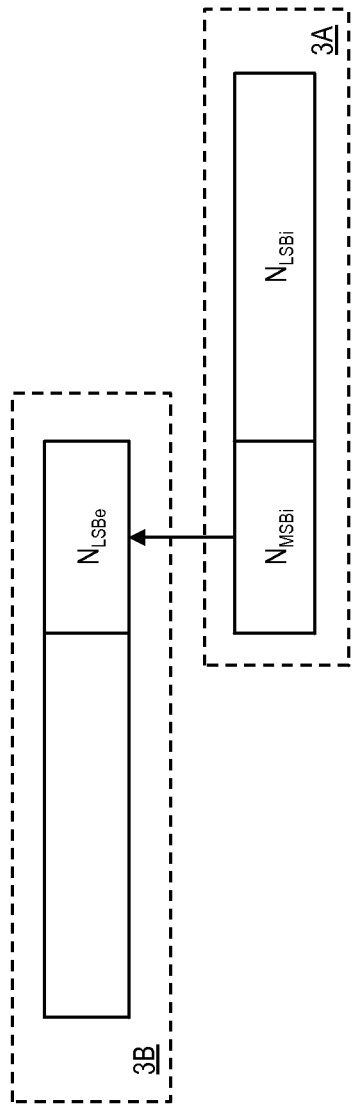
FIG. 3 illustrates a block diagram depicting the transfer of content in a reduced number of bits of the memory cell (such as in the method of FIG. 2), in accordance with example embodiments of the present invention.

According to a second further embodiment, in step S40, the content in only a reduced number of bits of the memory cell in the internal memory 3A, which contains the determined maximum frequency value from frequency values in memory cells of the internal memory 3A corresponding to a column of the display 4, is transferred to the corresponding memory cell of the external memory 3B. By way of example, with reference to FIG. 3, the content of only a number $N_{MSBi}$ of most significant bits in the corresponding memory cell of the internal memory 3A are transferred to the corresponding memory cell of the external memory 3B, whereas the content in the corresponding number $N_{LSBi}$ of least significant bits remains in the corresponding memory cell of the internal memory 3A. The transferred content of the number $N_{MSBi}$ of most significant bits of the corresponding memory cell of the internal memory 3A is stored in the corresponding number $N_{LSBe}$ of least significant bits of the corresponding memory cell in the external memory 3B ($N_{MSBi}=N_{LSBe}$). Then, in the next step S50, only the number $N_{MSBi}$ of most significant bits in the corresponding memory cell of the internal memory 3A, whose content are transferred to the corresponding memory cell in the external memory 3B are reset in the first further embodiment of the inventive method.

According to a third further embodiment, in step S40, the detected maximum frequency value corresponding to a column of the display 4 is transferred from a memory cell of the internal memory 3A to a corresponding cell of the external memory 3B, simultaneously with neighboring frequency values, which are stored in memory cells of a memory block in the internal memory 3A and respectively in the external memory cell 3B, which are read and respectively written by the same burst. In the next step S50, the memory cells in the internal memory 3A, in which the determined and transferred maximum frequency value and the transferred neighboring frequency values are stored, are reset.

Figure 4:
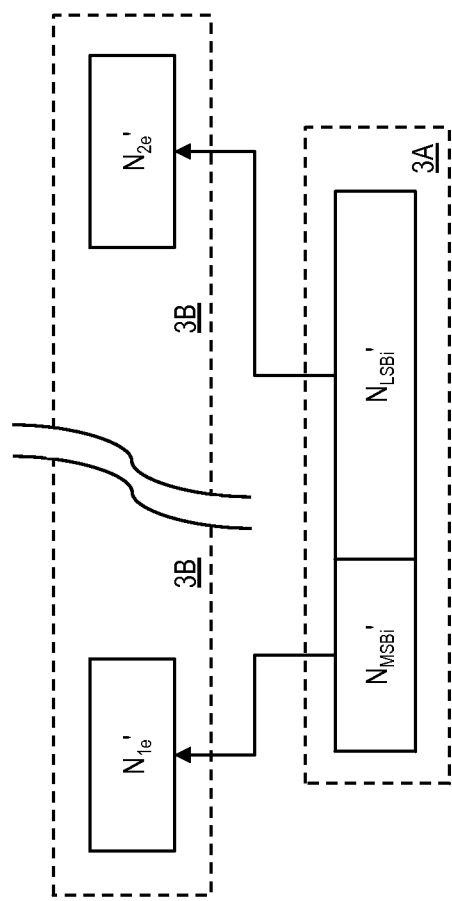
FIG. 4 illustrates a block diagram depicting the transfer of content in a memory cell of the internal memory to different memory cells of external memory (such as in the method of FIG. 2), in accordance with example embodiments of the present invention.

According to a fourth further embodiment, with reference to FIG. 4, the content of a number $N_{MSBi}'$ of most significant bits in a memory cell of the internal memory 3A, which contains the determined maximum frequency value corresponding to a column of the display 4, is transferred to a first memory cell of the external memory 3B, if the content of the number $N_{MSBi}'$ of most significant bits in the memory cell of the internal memory 3A is different from the value zero, whereas the content in the corresponding number $N_{LSBi}'$ of least significant bits is transferred to a second memory cell of the external memory 3B. As shown in FIG. 4, the number $N_{1e}'$ of bits in the first memory cell in the external memory 3B corresponds to the number $N_{MSBi}'$ of most significant bits in the memory cell of the internal memory 3A with the determined maximum frequency value. The number $N_{2e}'$ of bits in the second memory cell in the external memory 3B corresponds to the number $N_{LSBi}'$ of least significant bits in the memory cell of the internal memory 3A with the determined maximum frequency value. The first memory cell and the second memory are positioned in different memory blocks of the external memory 3B—symbolically shown by a double slope in FIG. 4—and are consequently read resp. written by a different burst.

Figure 5:
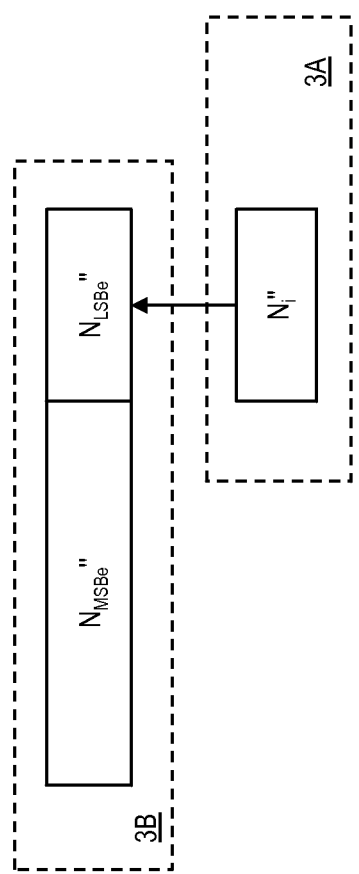
FIG. 5 illustrates a block diagram showing the transfer of content to a reduced number of bits in a memory cell of the external memory, in accordance with example embodiments of the present invention.

According to a fifth further embodiment, with reference to FIG. 5, the length $N_i''$ of the memory cells in the internal memory 3A is smaller than the total length $N_{MSB}''+N_{LSB}''$ of the memory cells in the external memory 3B. Consequently, data to several memory cells in the external memory can be transferred simultaneously in one burst, whereas the transfer of data from a memory cell in the internal memory 3A to a corresponding memory cell in the external memory 3B has to be performed more often within one update cycle. By way of example, the maximum frequency value is transferred from a memory cell in the internal memory 3A to a number $N_{LSB}''$ of least significant bits of the corresponding memory cell in the external memory 3B, whereby the number $N_{LSB}''$ of least significant bits of the memory cells of the external memory 3B is larger than the number $N_i''$ of bits in the memory cells in the internal memory 3A. Within one update cycle each transferred maximum frequency value is added to the frequency value stored already in the number $N_{LSB}''$ of least significant bits in the corresponding memory cell in the external memory 3B. If the number $N_{LSB}''$ of least significant bits in the memory cell of the external memory 3B is not sufficient for the result of that addition, an add carry from the least significant bits to the most significant bits in that memory cell in the external memory 3B has to be performed. By way of further example, the number $N_{LSB}''$ of least significant bits in the memory cells of the external memory 3B is parameterized in such a manner, that a time consuming add carry from the least significant bits to the most significant bits occurs comparatively very rarely. The separation of each memory cell in the external memory 3B in least significant bits and most significant bits and the transfer of the maximum frequency value from the internal memory 3A to only the least significant bits of the memory cell in the external memory 3B enables the integrated transfer of data to several memory cells in the external memory 3B within one burst of the data transfer.

According to a sixth further embodiment, in step S50, the memory cell in the internal memory 3A, which contains the determined maximum frequency value corresponding to a column of the display 4, is reset to an initial value being different to zero instead of a reset to the value zero—e.g., when a line-mode according to US 2009/0009524 A1 is used. If the maximum frequency value corresponding to a column of the display determined in step S40 is a positive value, the selected initial value is a negative value. If the maximum frequency value corresponding to a column of the display determined in step S40 is a negative value, the selected initial value is a positive value.

The selection of the most negative possible value for the initial value in case of a positive maximum frequency value corresponding to a column of the display determined in method step S40 may be disadvantageous, because a decrement in that memory cell in the next update cycle which can also occur can result in an overflow. Further, the selection of a high negative value for the initial value may also be disadvantageous, because if only few increments of this memory cell occurs in the next update cycle, it can be erroneously determined as negative maximum frequency value.

Analogously, the selection of the most positive possible value for the initial value in case of a negative maximum frequency value corresponding to a column of the display may be disadvantageous, because an increment in that memory cell in the next update cycle can result in an overflow. Further, the selection of a high positive value for the initial value may also be disadvantageous, because if only few decrements of this memory cell occurs in the next update cycle, it can be erroneously determined as positive maximum frequency value.

The invention is not limited to the described embodiments. Additionally, the scope of the invention comprises all combinations of all of the features claimed in the claims, all the features disclosed in the description and all the features shown in the figures of the drawings. The features of the method claims can also be features of the device claims and vice versa.

What is claimed is:

1. A method for storing frequency values, comprising:
   actualizing a frequency value contained in a memory cell of an internal memory of a device by an increment or a decrement, wherein each of a number of memory cells of the internal memory contains a respective frequency value;
   after a predetermined number of increments and/or decrements in the memory cells of the internal memory, determining a maximum frequency value of the frequency values in the memory cells of the internal memory, and transferring the maximum frequency value to a corresponding memory cell of an external memory of the device;
   resetting the memory cell of the internal memory that contains the transferred maximum frequency value;
   reading content of each memory cell of the internal and external memory after a period of time; and
   resetting each memory cell in the internal and external memory; and
   wherein the internal and external memory are components of a display memory of a display, which comprises a number of columns, and the period of time is an update cycle of the display,
   wherein the increment and respectively the decrement is a hit of a sampled value of a measured signal in a sampled value range and in a time point and respectively in a frequency bin of a pixel of the display corresponding to the memory cell of the internal memory within the update cycle, wherein, for each column of the display, the maximum frequency value is determined from the frequency values in the memory cells of the internal memory corresponding to all pixels of the respective column after a specific number of increments and decrements in the memory cells of the internal memory corresponding to all pixels of the corresponding column, and the read content is for updating the pixels of the display, and wherein each maximum frequency value of several memory cells in the internal memory is transferred in one burst to a specified number of least significant bits in a corresponding memory cell of the external memory, wherein the number of least significant bits in the memory cells of the external memory is comparatively larger than the number of bits in the memory cells of the internal memory.

2. The method according to claim 1, wherein the maximum frequency value of the frequency values in memory cells of the internal memory corresponding to all pixels of a one of the columns, which is incremented or decremented since a last transfer of the maximum frequency value corresponding to the one column, is transferred to the corresponding memory cell of the external memory.

3. The method according to claim 1, wherein the maximum frequency value of each column is transferred to the corresponding memory cell of the external memory after the specific number of increments and decrements plus an integer valued offset, which is different for each column.

4. The method according to claim 1, wherein the transferred maximum frequency value only contains a reduced number of most significant bits of the total number of bits of a memory cell of the internal memory.

5. The method according to claim 1, wherein the maximum frequency value determined for each column of the display, and all the frequency values, are stored in memory cells of the external memory, which are read and respectively written in a same burst, and are transferred simultaneously from the internal memory to the external memory.

6. The method according to claim 5, wherein the frequency values, which are transferred simultaneously with the maximum frequency value determined for the corresponding column of the display, and the determined maximum frequency value, are stored in memory cells of the internal memory, which are read and respectively written simultaneously.

7. The method according to claim 1, wherein a content of a specific number of most significant bits of the memory cell of the internal memory, in which the maximum frequency value is stored, is transferred to a first memory cell of the external memory, if the content of the most significant bits differ from zero, and the content of a corresponding number of least significant bits of the memory cell of the internal memory is transferred to a second memory cell of the external memory.

8. The method according to claim 7, wherein the content of the least significant bits in the memory cell of the internal memory and respectively of the external memory is read and respectively written in a different burst to the content of the most significant bits in the memory cell of the internal memory and respectively of the external memory.

9. The method according to claim 1, wherein, if the number of least significant bits in the memory cell of the external memory is not sufficient for storing at least two maximum frequency values corresponding to one memory cell which are transferred and added within one update cycle, an add carry from the least significant bits to a number of most significant bits in the memory cell of the external memory is performed.

10. The method according to claim 1, wherein resetting includes initializing with an initial value.

11. The method according to claim 10, wherein the initial value is a negative value in the reset memory cell of the internal memory, if the transferred maximum frequency value is a positive value or the initial value is a positive value in the reset memory cell of the internal memory, if the transferred maximum frequency value is a negative value.

12. A device comprising:
a display including an internal memory and an external memory connected to each other, wherein the internal memory comprises a number of memory cells, each configured to store a respective frequency value, wherein the display comprises a number of columns;
an actualizing unit configured to actualize the frequency value in a one of the memory cells of the internal memory by an increment or a decrement; and
a control unit configured to, after a predetermined number of increments and decrements in the memory cells of the internal memory, determine a maximum frequency value of the frequency values stored in the memory cells of the internal memory, and to transfer the determined maximum frequency value to a corresponding memory cell of the external memory; and
wherein the control unit is further configured to reset the memory cell of the internal memory that contains the transferred maximum frequency value, to read content of each memory cell of the internal and external memory after a period of time, and to reset each memory cell of the internal and external memory; and
wherein the period of time is an update cycle of the display,
wherein the increment and respectively the decrement is a hit of a sampled value of a measured signal in a sampled value range and in a time point and respectively in a frequency bin of a pixel of the display corresponding to the memory cell of the internal memory within the update cycle,
wherein, for each column of the display, the maximum frequency value is determined from the frequency values in the memory cells of the internal memory corresponding to all pixels of the respective column after a specific number of increments and decrements in the memory cells of the internal memory corresponding to all pixels of the corresponding column, and the read content is for updating the pixels of the display, and
wherein each maximum frequency value of several memory cells in the internal memory is transferred in one burst to a specified number of least significant bits in a corresponding memory cell of the external memory, wherein the number of least significant bits in the memory cells of the external memory is comparatively larger than the number of bits in the memory cells of the internal memory.

13. The device according to claim 12, wherein the device is a measuring device for displaying frequency values of a measured signal on the display of the device, and the frequency values are stored to update the display.

14. The device according to claim 13, further comprising a buffer located between the internal memory and the external memory, wherein the buffer is configured to buffer the transferred maximum frequency value corresponding to each column of the display.

15. A method for storing frequency values, comprising:
actualizing a frequency value contained in a memory cell of an internal memory of a device by an increment or a decrement, wherein each of a number of memory cells of the internal memory contains a respective frequency value;
after a predetermined number of increments and/or decrements in the memory cells of the internal memory, determining a maximum frequency value of the frequency values in the memory cells of the internal memory, and transferring the maximum frequency value to a corresponding memory cell of an external memory of the device;
resetting the memory cell of the internal memory that contains the transferred maximum frequency value;
reading content of each memory cell of the internal and external memory after a period of time; and
resetting each memory cell in the internal and external memory;
wherein the internal and external memory are components of a display memory of a display and the period is an update cycle of the display, which comprises a number of columns,
wherein the increment and respectively the decrement is a hit of a sampled value of a measured signal in a sampled value range and in a time point and respectively in a frequency bin of a pixel of the display corresponding to the memory cell of the internal memory within the update cycle,
wherein, for each column of the display, the maximum frequency value is determined from the frequency values in the memory cells of the internal memory corresponding to all pixels of the respective column after a specific number of increments and decrements in the memory cells of the internal memory corresponding to all pixels of the corresponding column, and the read content is for updating the pixels of the display, and
wherein the maximum frequency value of each column is transferred to the corresponding memory cell of the external memory after the specific number of increments and decrements plus an integer valued offset, which is different for each column.

* * * * *